US 6,703,686 B2

(12) United States Patent
Konishi et al.

(10) Patent No.: US 6,703,686 B2
(45) Date of Patent: Mar. 9, 2004

(54) SEMICONDUCTOR DEVICE

(75) Inventors: Takahiko Konishi, Kyoto (JP);
Masahiko Takeno, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/116,102

(22) Filed: Apr. 5, 2002

(65) Prior Publication Data

US 2003/0189240 A1 Oct. 9, 2003

(51) Int. Cl.[7] .................. H01L 27/082; H01L 27/102; H01L 29/70; H01L 31/111
(52) U.S. Cl. .............. 257/588; 257/585; 257/586; 257/587
(58) Field of Search ................ 257/587, 588, 257/581, 578, 585, 6

(56) References Cited

U.S. PATENT DOCUMENTS

| | | | | |
|---|---|---|---|---|
| 4,897,704 A | * | 1/1990 | Sakurai | 357/35 |
| 5,319,239 A | * | 6/1994 | Ning | 257/585 |
| 5,523,614 A | * | 6/1996 | Hashimoto | 257/578 |
| 5,607,867 A | * | 3/1997 | Amerasekera et al. | 437/31 |
| 5,612,562 A | * | 3/1997 | Siaudeau et al. | 257/328 |
| 5,614,750 A | * | 3/1997 | Ellul et al. | 257/386 |
| 5,798,561 A | * | 8/1998 | Sato | 257/588 |
| 5,861,640 A | * | 1/1999 | Gomi | 257/197 |
| 5,869,881 A | * | 2/1999 | Lee et al. | 257/586 |
| 6,028,344 A | * | 2/2000 | Hashimoto | 257/587 |
| 6,559,517 B2 | * | 5/2003 | Zhu | 257/591 |

FOREIGN PATENT DOCUMENTS

JP 5-36712 * 8/1991 ................ 257/587

* cited by examiner

*Primary Examiner*—B. William Baumeister
*Assistant Examiner*—Jesse A. Fenty
(74) *Attorney, Agent, or Firm*—Rabin & Berdo, P.C.

(57) ABSTRACT

An n-type low impurity concentration semiconductor layer is provided, by epitaxial growth or the like, on a p-type semiconductor substrate. In order to vertically form a semiconductor device in the low impurity concentration semiconductor layer, at least a p-type diffusion region is provided. In a surface of the semiconductor layer, a collector electrode and a base electrode are respectively formed in electrical connection to the n-type low impurity concentration semiconductor layer and the p-type diffusion region. The collector electrode is formed on a surface of the $n^+$-type low resistance region of a polycrystal semiconductor formed depthwise in the low impurity concentration semiconductor layer. As a result, a semiconductor device is obtained that a low resistance region can be formed without increasing the thickness of an eitaxial growth layer while having less effect of diffusion or the like upon other regions where forming depthwise, for example, a low resistance region called a transistor collector wall in a semiconductor layer to provide connection to an electrode.

6 Claims, 4 Drawing Sheets

# SEMICONDUCTOR DEVICE

FIELD OF THE INVENTION

The present invention relates to a semiconductor device having electrodes formed on a surface of a semiconductor layer while vertically forming a pn junction in the semiconductor layer, e.g. transistors or diodes on an IC or LSI. More particularly, the invention relates to a semiconductor device having a structure not to impair device characteristic while reducing the series resistance between the electrode connected to a lower layer of a vertically formed device and the lower layer.

BACKGROUND OF THE INVENTION

The bipolar transistor, formed as a part of an IC, has an n-type semiconductor layer 22 epitaxially grown, e.g. in a thickness of approximately 10 $\mu$m, on the surface of a p-type semiconductor substrate 21, as shown in FIG. 5A. Through the surface, p-type and n-type impurities are diffused in order, to form a base region 23 and an emitter region 24. The semiconductor layer 22 is used as a collector region. The transistor is formed having a vertical current path I, as shown in FIG. 5A.

In the case of a discrete transistor, an $n^+$-type substrate may be used as a semiconductor substrate 21 to form a collector electrode at a backside thereof. In the case of an IC, used is a p-type semiconductor substrate having a conductivity type different from a conductivity type of a device-forming semiconductor layer, in order for electrical isolation between devices, as shown in FIG. 5A. A collector electrode 25 is provided on the surface of the semiconductor layer 22. On the base region 23 and the emitter region 24, a base electrode 26 and an emitter electrode 27 are respectively provided through an insulation film 28 on the surface of the semiconductor layer 22.

In this case, the semiconductor layer 22 cannot sufficiently increase its impurity concentration in an attempt to obtain a desired transistor characteristic, i.e. grown in an impurity concentration of approximately $5\times10^{13}$–$1\times10^{17}$ cm$^{-3}$. Because of the resistance increase through the path to the collector electrode, an $n^+$-type (impurity concentration of approximately $1\times10^{19}$ cm$^{-3}$) low resistance region 22a called a collector wall is formed extending from an upper surface of the semiconductor layer 22 toward a lower surface thereof as shown in FIG. 5A. A collector electrode 25 is formed in contact with the low resistance region 22a. Incidentally, although not shown, there is a case that an $n^+$-type buried layer is formed in the boundary, below the base region 23, between the semiconductor substrate 21 and the semiconductor layer 22, in order to reduce the resistance in a lateral direction of the semiconductor layer 22 in the below of the base region 23.

As in the foregoing transistor structure, in the case of forming an electrode on the surface of the semiconductor layer despite a contact is to be taken to a layer beneath the semiconductor layer, a low resistance region 22a is formed extending from the upper surface of the semiconductor layer 22 to nearly the reach point to the lower surface, in order to reduce the resistance along the path. However, because the low resistance region is generally formed by diffusion after epitaxial growth of the semiconductor layer 22, the impurity in the semiconductor layer 21 diffuses into the semiconductor layer 22 during the diffusion, as shown in FIG. 5B. This results in a problem that the impurity concentration in the semiconductor layer 22 deviates from its desired characteristic of device.

Meanwhile, in the case of forming a device only in a less-diffusive region of the semiconductor layer without using the above region in anticipation of the diffusion, the epitaxially-grown semiconductor layer requires thickness increase. The diffusion distance of from the semiconductor substrate to the semiconductor layer is approximately 2–3 $\mu$m, requiring thickness increase correspondingly. This raises a problem with time increase in epitaxial growth and hence cost increase. In the case of forming a buried layer in the lower surface of the semiconductor layer, impurity concentration similarly varies in the semiconductor layer.

SUMMARY OF THE INVENTION

The present invention has been made in order to solve these problems. It is an object to provide a semiconductor device that a low resistance region can be formed without increasing the thickness of an eitaxial growth layer while having less effect of diffusion or the like upon other regions where forming, for example, a low resistance region called a transistor collector wall depthwise in a semiconductor layer to provide connection to an electrode.

A semiconductor device according to the present invention includes: a semiconductor substrate; a first conductivity type low impurity concentration semiconductor layer formed on the semiconductor substrate; a second conductivity type diffusion region at least provided to vertically form a semiconductor element in the low impurity concentration semiconductor layer; and first and second electrodes formed in a surface of the semiconductor layer respectively electrically connected to the first conductivity type low impurity concentration semiconductor layer and the second conductivity type diffusion region; wherein the first electrode is formed on a surface of a first conductivity type low resistance region of a polycrystal semiconductor formed depthwise in the low impurity concentration semiconductor layer.

With this structure, the low resistance region formed by a polycrystal semiconductor layer has an impurity diffusion coefficient 10 times greater than that of a single crystal semiconductor layer. Diffusion is possible to a lower surface of the polycrystal semiconductor layer at a rate by far faster than the diffusion of from the semiconductor substrate into the semiconductor layer. This makes it possible to easily form a high impurity concentration low resistance region without incurring performance lowering due to the diffusion into a semiconductor device. As a result, a high-performance semiconductor device can be formed without increasing series resistance.

In order to form such a polycrystal-semiconductor low resistance region, for example an insulation film such as SiO$_2$ is formed over the entire surface of the semiconductor substrate and then patterned. Otherwise, a polycrystal semiconductor film is formed only on an area for a low resistance region by a lift-off technique. Thereafter, a first conductivity type semiconductor layer is epitaxially grown in a desired impurity concentration to a desired thickness, similarly to the conventional. By doing so, a single-crystal semiconductor layer grows matching to the semiconductor-substrate single crystal in an area free of the insulation film or polycrystal semiconductor film whereas no single-crystal semiconductor layer grows on the insulation film or polycrystal semiconductor film but a polycrystal semiconductor layer grows. As a result, a polycrystal semiconductor layer is formed in a part for a low resistance region, simultaneously with epitaxially growing a semiconductor layer. Then, a diffusion region is formed for device formation, and a first conductivity type impurity is diffused also through the area for a low resistance region. The part for a low resistance region is formed by a polycrystal semiconductor layer to have a high diffusion coefficient, and hence cannot be made into a high-concentration impurity diffused region in a short time.

DETAILED DESCRIPTION

Figure 1:
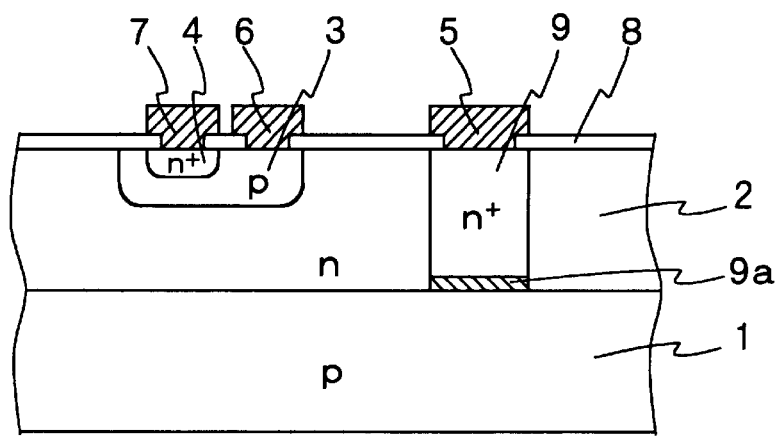
FIG. 1 is a sectional explanatory view showing one embodiment of a semiconductor device according to the present invention.

A semiconductor device of the present invention includes one embodiment of a bipolar transistor, as shown in a sectional explanatory view of FIG. 1. For example, on a p-type semiconductor substrate 1, a low impurity concentration semiconductor layer 2 of a first conductivity type (n-type) is provided by epitaxial growth or the like. In the low impurity concentration semiconductor layer 2, at least a second conductivity type (p-type) diffusion region 3 is provided in order to vertically form a semiconductor device. On a surface of the semiconductor layer, first and second electrodes (collector electrode 5 and base electrode 6) are respectively formed in electrical connection with the n-type low impurity concentration semiconductor layer 2 and p-type diffusion region 3. This collector electrode 5 is formed on a surface of the n$^+$-type low resistance region 9 of polycrystal semiconductor formed depthwise in the low impurity concentration semiconductor layer 2.

In the example shown in FIG. 1, the device to be formed in the semiconductor layer 2 is a transistor. A p-type impurity, such as boron, is diffused from a surface of the low impurity concentration n-type semiconductor layer 2 epitaxially grown, thereby forming a base region 3 having an impurity concentration of approximately $1 \times 10^{17}$ cm$^{-3}$ to a depth of approximately 2–3 μm. Furthermore, an n-type impurity, such as phosphorus, is diffused in the base region 3, thereby forming an emitter region 4 having an impurity concentration of approximately $1 \times 10^{20}$ cm$^{-3}$ to a depth of approximately 1–2 μm. The semiconductor layer 2 is rendered as a collector region. On the surface of the low resistance region 9, a collector electrode 5 is formed through a contact hole in the insulation film 8, and connected to the base region 3 and emitter region 4. A base electrode 6 and an emitter electrode 7 are formed of a metal of Al or the like. However, the invention is true for the case with a diode structure forming only a p-type diffusion region 3 in the n-type semiconductor layer 2 without forming an emitter region.

The semiconductor substrate 1 is a p-type silicon subwafer having an impurity concentration of approximately $1 \times 10^{16}$ cm$^{-3}$, for example, on which surface the low impurity concentration semiconductor layer 2 of an n-type silicon single crystal having an impurity concentration of approximately $1 \times 10^{15}$ cm$^{-3}$ is epitaxially grown to a thickness of approximately 5–10 μm. Prior to growing the semiconductor layer 2, polysilicon instead of a single crystal is deposited on an area corresponding to the low resistance region 9 in a site to form a collector electrode 5. In order to deposit such a polysilicon film, an insulation film 9a or a polysilicon film is previously formed on the surface of the semiconductor substrate 1. Epitaxial growth is made over the surface of the semiconductor substrate 1. Epitaxial growth proceeds in an area where the semiconductor substrate 1 is exposed. However, epitaxial growth is not done on the insulation film 9a or polysilicon film, resulting in polysilicon deposition.

An n-type impurity, such as phosphorus, is ion-implanted at a dose of approximately $1 \times 10^{15}$ cm$^{-2}$ to a surface of the polysilicon layer. Then, diffusion process is carried out at approximately 1000° C. for 30 minutes. Because the polysilicon layer has a diffusion coefficient about 10 times greater than that of a single-crystal silicon layer, diffusion can be done down to a lower surface of the polysilicon layer for a short period of time. Thus, an n-type low resistance region 9 is formed with an impurity concentration of approximately $1 \times 10^{20}$ cm$^{-3}$, which is called a transistor collector wall. Because the diffusion time is extremely short, there is less diffusion from the semiconductor substrate 1 into the semiconductor layer 2, thus causing no problem.

Now, a method for manufacturing a semiconductor device as shown in FIG. 1 will be explained with reference to FIGS. 2A–2C and 3A–3D, centering on a way of forming a polysilicon layer to provide a low resistance region 9.

Figure 2A:
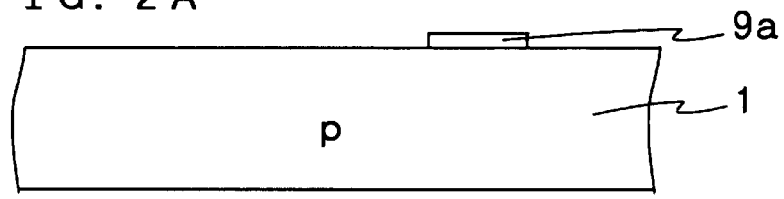
FIGS. 2A–2C are explanatory views showing an example of a process to manufacture a semiconductor device shown in FIG. 1.
Figure 2B:
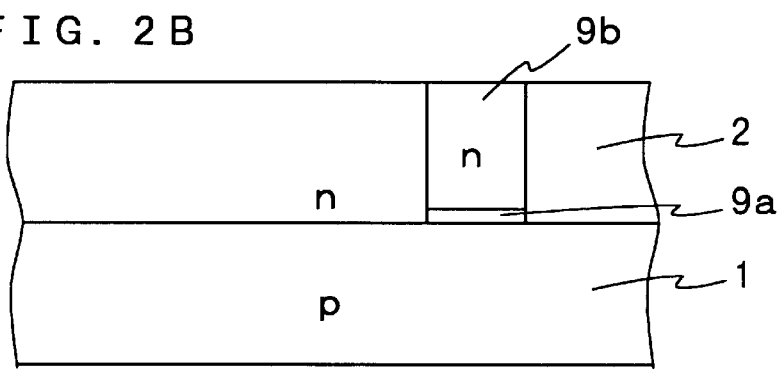
Figure 2C:
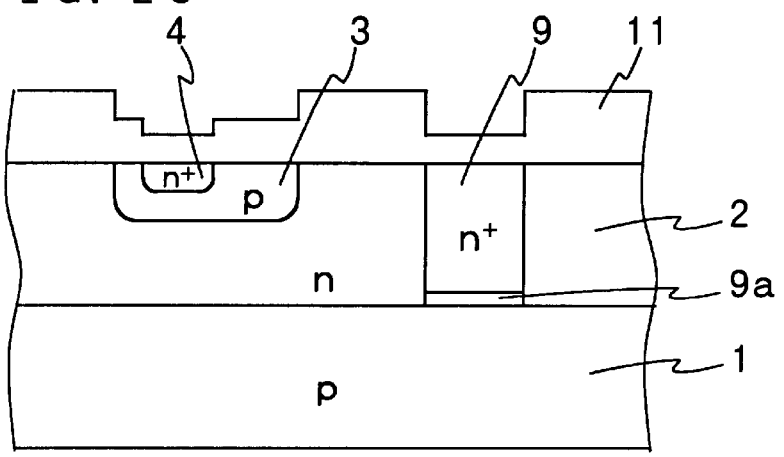

FIGS. 2A–2C show an example using an insulation film of an oxide film or the like. First, as shown in FIG. 2A, an insulation film, e.g. SiO$_2$, is deposited over the entire surface by a CVD process or the like. This is patterned to be left only in a site where a low resistance region is to be formed. Similarly to the conventional semiconductor layer growth, silicon having an impurity concentration of approximately $1 \times 10^{15}$ cm$^{-3}$ is epitaxially grown. As shown in FIG. 2B, a silicon single crystal semiconductor layer 2 is grown in an area other than the insulation film 9a while a polysilicon layer 9b deposits on the insulation film 9a.

Thereafter, as shown in FIG. 2C, a mask 11 of SiO$_2$ or the like is formed on the surface of the semiconductor layer. An opening is formed in an area for base formation to diffuse a p-type impurity, thereby forming a base region 3. Then, openings are formed in areas for emitter and low-resistance region formation to diffuse an n-type impurity, thereby simultaneously forming an emitter region 4 and a low resistance region 9. Thereafter, a contact hole is formed, and then an lectrode material Al is evaporated and patterned to form a collector electrode 5, a base electrode 6 and an emitter electrode 7, thereby forming a transistor having a structure shown in FIG. 1.

The example shown in FIGS. 2A–2C formed an insulation film 9a in an area to form a polysilicon layer for a low resistance region. However, in the case that the semiconductor substrate 1 is p-type different in conductivity type from the semiconductor layer 2 as in examples shown in FIG. 1, there is no significance in connecting the low resistance region 9 to the semiconductor substrate 1. Accordingly, an insulation film can be used because of no problem in electrical cut off by the insulation film. However, where the semiconductor substrate 1 is the same conductivity type as the semiconductor layer 2 and has a high impurity concentration, by connecting the low resistance region 9 directly to the semiconductor substrate 1, low resistance is preferably obtained also in the lateral direction through the semiconductor substrate. There is shown, in FIG. 3, an example of a manufacturing process to electrically connect the low resistance region 9 to the semiconductor substrate 1.

Figure 3A:
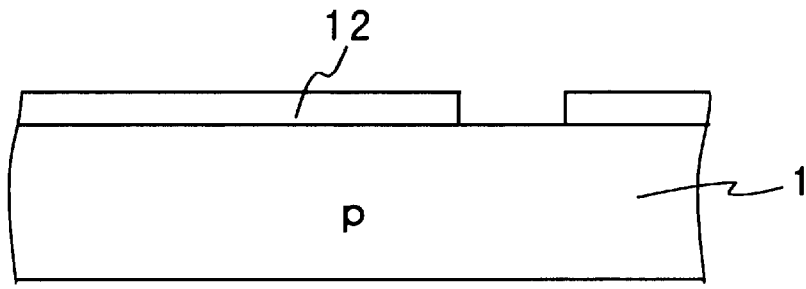
FIGS. 3A–3D are process explanatory views showing another example to manufacture a semiconductor device shown in FIG. 1.
Figure 3B:
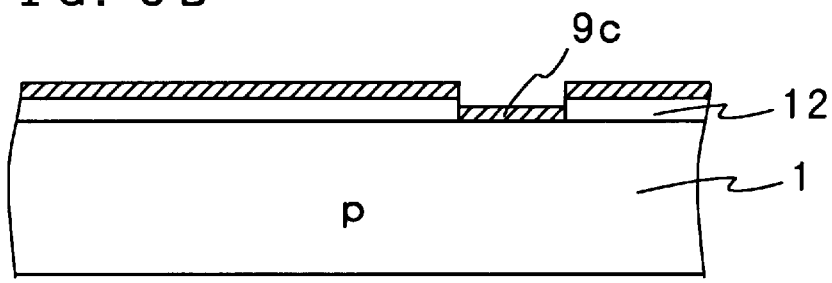
Figure 3C:
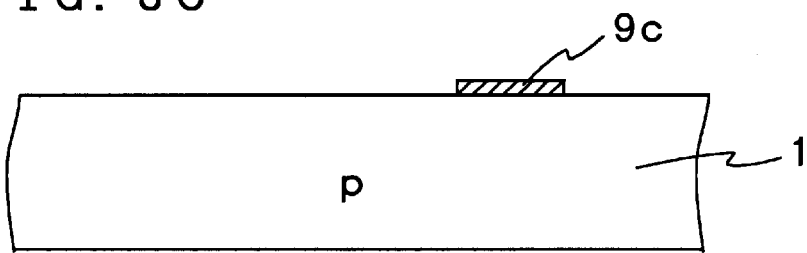

First, as shown in FIG. 3A, an insulation film 12, such as $SiO_2$, is formed over the entire surface of the semiconductor substrate 1 by a CVD process or the like and patterned, thereby forming an opening only in an area for a low resistance region. Then, as shown in FIG. 3B, a polysilicon film 9c is deposited over the entire surface to a thickness of approximately 1 $\mu$m by the CVD process. Thereafter, by erosively removing the insulation film 12 by a hydrogen fluoride solution or the like, the polysilicon film in areas other than that for a low resistance region is removed together with the insulation film 12 (lift-off technique), as shown in FIG. 3C. Thus, a polysilicon film 9c is formed only in the area for a low resistance region.

Figure 3D:
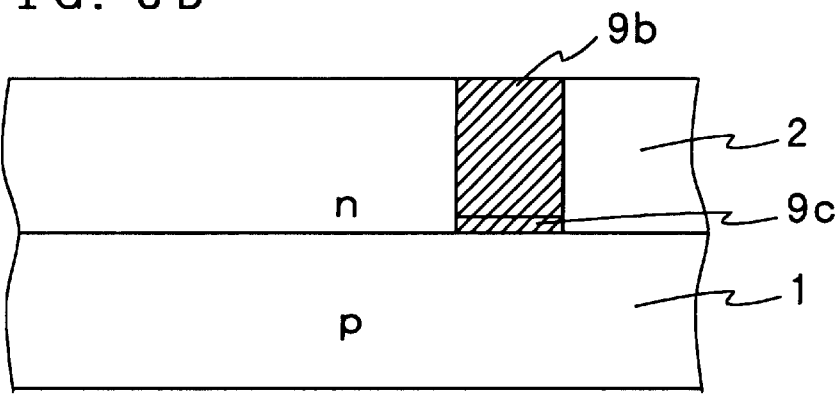

Thereafter, by epitaxially growing Si similarly to the example shown in FIG. 2B, a semiconductor layer 2 grows of a silicon single crystal in areas other than the polysilicon film 9c while a polysilicon layer 9b deposits on the polysilicon film 9c, as shown in FIG. 3D. Thereafter, a base region 3, an emitter region 4 and a low resistance region 9 are formed similarly to FIG. 2C. By forming electrodes, obtained is a semiconductor device having a similar structure to FIG. 1 having the low resistance region 9 in direct contact with the semiconductor substrate 1.

According to the semiconductor device of the invention, because a low resistance region is formed by impurity diffusion to a polycrystal semiconductor, such as polysilicon, the impurity diffuses at a rapid rate. It is therefore possible to carry out diffusion without undergoing the effect that the impurity in the semiconductor substrate diffuses into the semiconductor layer. Accordingly, the epitaxial growth layer is satisfactorily formed not so thick. The epitaxial layer is reduced in variation and shortened in growth time, improving producibility. As a result, it is possible to connect at a reduced resistance between the bottom end of the semiconductor layer and the electrode provided on the surface thereof without lowering the characteristic of the device, such as a transistor, formed on the semiconductor layer.

Figure 4A:
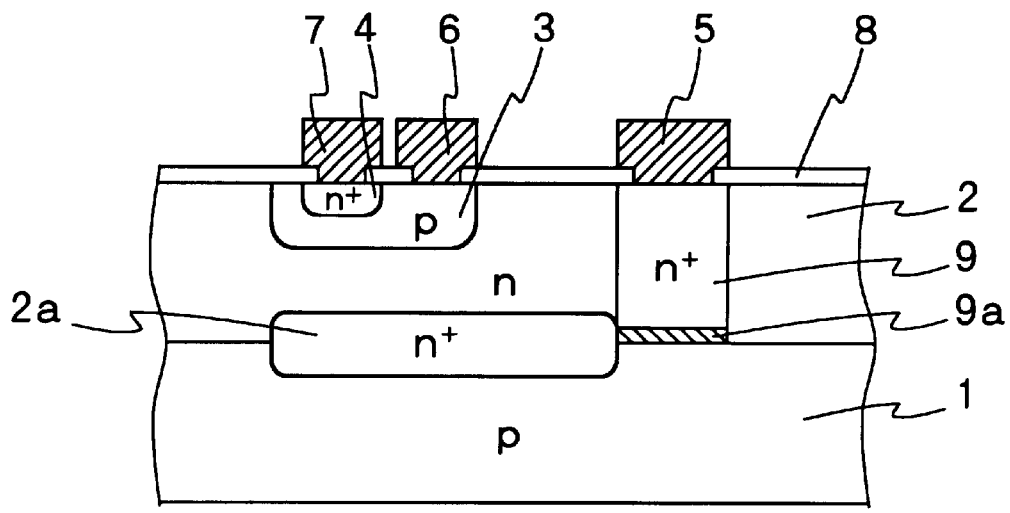
FIGS. 4A and 4B are sectional explanatory views showing variations of the structures of the embodiments of the invention respectively shown in FIGS. 1 and 3D.
Figure 4B:
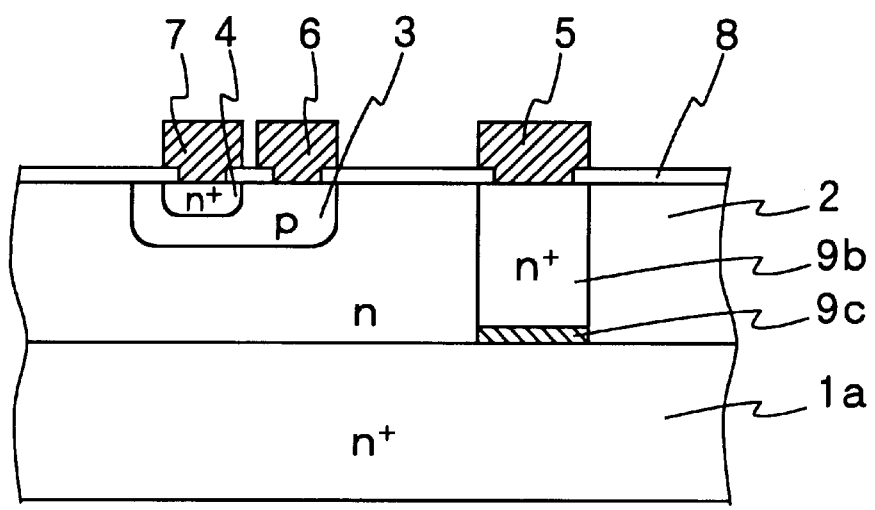
Figure 5A:
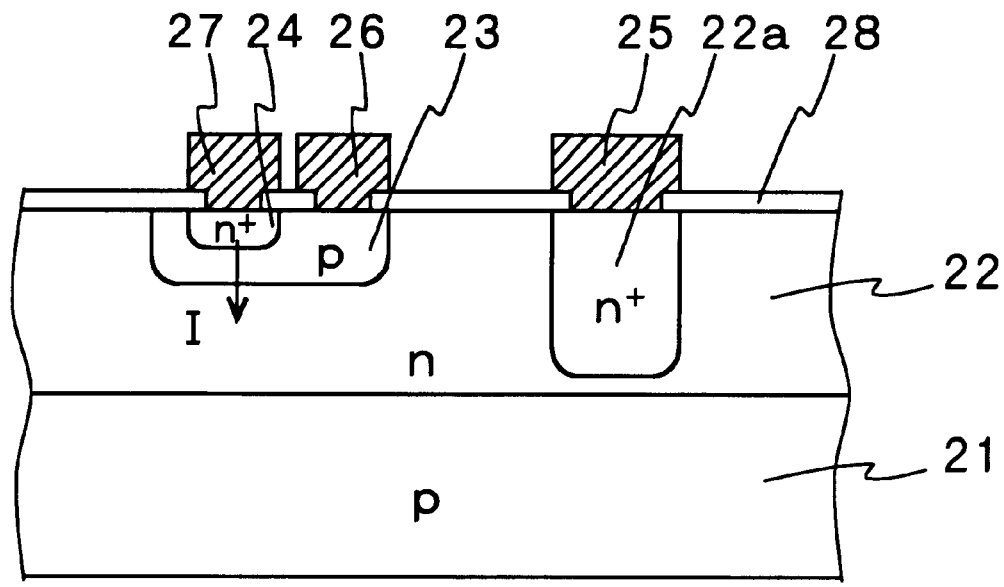
FIGS. 5A and 5B are section explanatory views showing the related-art transistor structure having a collector wall.
Figure 5B:
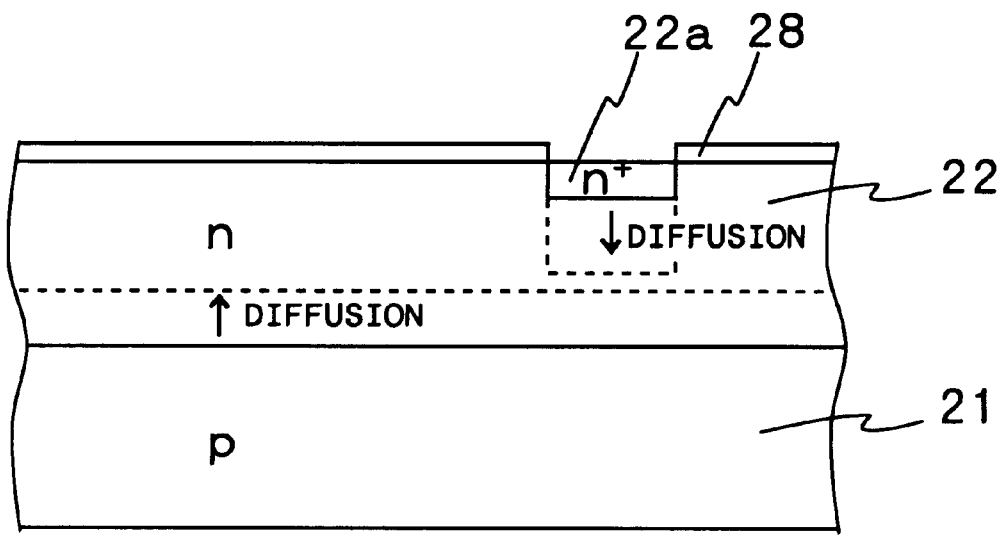

In the above example, the transistor base region has, at the beneath, an n-type semiconductor layer 2 and a p-type semiconductor substrate 1. However, an $n^+$-type buried region 2a may be formed at the boundary as shown in FIG. 4A or an $n^+$-type semiconductor substrate 1a be used as shown in FIG. 4B. This provides resistance reduction also in the lateral direction, further eliminating resistance loss. Incidentally, in FIGS. 4A and 4B, the same elements as those of FIG. 1 or 3D are attached with the same reference numerals, to omit explanation.

Although in the foregoing example the low resistance region was a transistor collector wall, this is true for the case that, instead of a transistor, a diode at one electrode is connected at low resistance. Furthermore, although the semiconductor layer used silicon and the polycrystal semiconductor layer used polysilicon, another semiconductor, such as SiC, may be used.

According to the invention, while connecting at extremely low resistance between the underside of the semiconductor layer and the electrode provided on the surface thereof, it is possible to substantially eliminate the effect of forming a low resistance region upon the characteristics of other devices. As a result, a high characteristic semiconductor device is obtained. Furthermore, according to the method of the invention, a low resistance region can be simultaneously formed with the usual semiconductor device on one hand, while diffusion can be made in a short time nearly the same degree as the diffusion for an emitter region. The epitaxial growth layer is satisfactorily small in thickness, which reduces manufacture time. As a result, an inexpensive high-performance semiconductor device is obtained.

What is claimed is:

1. A semiconductor device comprising:

a semiconductor substrate;

a first conductivity type low impurity concentration semiconductor layer formed on said semiconductor substrate;

a second conductivity type diffusion region at least provided to vertically form a semiconductor element in said semiconductor layer; and first and second electrodes formed in a surface of said semiconductor layer respectively electrically connected to said semiconductor layer and said diffusion region;

wherein said first electrode is formed on a surface of a first conductivity type low resistance region made of a polycrystal semiconductor said low resistance region being formed depthwise in said semiconductor layer and in contact with said semiconductor layer wherein an insulation layer is provided under said low resistance region only.

2. A semiconductor device comprising:

a semiconductor substrate;

a first conductivity type low impurity concentration semiconductor layer formed on said semiconductor substrate;

a second conductivity type diffusion region at least provided to vertically form a semiconductor element in said semiconductor layer; and first and second electrodes formed in a surface of said semiconductor layer respectively electrically connected to said semiconductor layer and said diffusion region;

wherein said first electrode is formed on a surface of a first conductivity type low resistance region made of a polycrystal semiconductor, said low resistance region being formed depthwise in said semiconductor layer and in contact with said semiconductor layer wherein a polysilicon film is provided under said low resistance region only.

3. A semiconductor device according to claim 1 or 2, wherein said semiconductor substrate is a second conductivity type, a first conductivity type buried layer having high impurity concentration being provided beneath said diffusion region, in an interface between said semiconductor substrate and said semiconductor layer.

4. A semiconductor device according to claim 1 or 2, wherein said semiconductor element has a diode structure.

5. A semiconductor device according to claim 1 or 2, wherein a first conductivity type diffusion region is further formed within said diffusion region thereby providing a bipolar transistor structure as said semiconductor element.

6. A semiconductor device according to claim 2, wherein said semiconductor substrate is a first conductivity type having high impurity concentration.

* * * * *